United States Patent
Shoji

(10) Patent No.: US 7,463,016 B2
(45) Date of Patent: *Dec. 9, 2008

(54) CURRENT SENSOR

(75) Inventor: Shigeru Shoji, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/546,901

(22) Filed: Oct. 13, 2006

(65) Prior Publication Data

US 2007/0096716 A1    May 3, 2007

(30) Foreign Application Priority Data

Oct. 14, 2005    (JP)    ............... 2005-300554

(51) Int. Cl.
*G01R 15/20* (2006.01)
*G01R 33/02* (2006.01)

(52) U.S. Cl. .................... 324/117 R; 324/252

(58) Field of Classification Search ............. 324/117 H, 324/117 R, 251–252
See application file for complete search history.

(56) References Cited

U.S. PATENT DOCUMENTS

| | | | | |
|---|---|---|---|---|
| 4,008,463 A | * | 2/1977 | Kryder | ................... 365/11 |
| 4,464,625 A | * | 8/1984 | Lienhard et al. | ......... 324/117 R |
| 4,496,932 A | * | 1/1985 | Halder | ................... 338/49 |
| 4,749,940 A | * | 6/1988 | Bullock | ................... 324/127 |
| 4,818,935 A | * | 4/1989 | Takahashi et al. | ........... 324/232 |
| 5,412,317 A | * | 5/1995 | Kyoizumi | ................ 324/207.14 |
| 5,438,257 A | * | 8/1995 | Berkcan | ................. 324/117 R |
| 5,473,244 A | * | 12/1995 | Libove et al. | .............. 324/126 |
| 5,587,651 A | * | 12/1996 | Berkcan et al. | ............. 324/127 |
| 5,621,377 A | * | 4/1997 | Dettmann et al. | ......... 338/32 R |
| 5,869,963 A | * | 2/1999 | Saito et al. | ................ 324/252 |
| 5,894,224 A | * | 4/1999 | De Jong | ................ 324/537 |
| 6,565,284 B2 | * | 5/2003 | Gearhart | ................. 405/37 |
| 6,707,298 B2 | * | 3/2004 | Suzuki et al. | ................ 324/252 |
| 6,727,683 B2 | * | 4/2004 | Goto et al. | ............. 324/117 H |
| 6,759,840 B2 | * | 7/2004 | Marasch et al. | ......... 324/117 H |
| 6,781,359 B2 | * | 8/2004 | Stauth et al. | ............ 324/117 H |
| 6,791,313 B2 | * | 9/2004 | Ohtsuka | ................ 324/117 H |
| 2005/0045359 A1 | * | 3/2005 | Doogue et al. | ............. 174/52.1 |
| 2006/0002031 A1 | * | 1/2006 | Shoji | ................ 360/313 |
| 2006/0071655 A1 | * | 4/2006 | Shoji | ................ 324/117 H |

(Continued)

FOREIGN PATENT DOCUMENTS

JP    A 6-294854    10/1994

*Primary Examiner*—Ha Tran T Nguyen
*Assistant Examiner*—Joshua Benitez
(74) *Attorney, Agent, or Firm*—Oliff & Berridge, PLC

(57) ABSTRACT

A current sensor includes a conductor line, and a magnetic sensor in which resistance value changes according to a current magnetic field produced by a current to be detected flowing through the conductor line. The conductor line includes: a pair of parallel portions each having a same and uniform cross-sectional area, while extending in parallel with each other separated at a first distance therebetween; a connecting portion connecting one end of one of the parallel portions and one end of the other of the parallel portions; and a pair of terminal portions each connected to the other end of each of the parallel portions, while extending to face with each other separated at a second distance therebetween, the second distance being wider than the first distance, the terminal portions each having a larger cross-sectional area than that of each of the parallel portions.

8 Claims, 12 Drawing Sheets

U.S. PATENT DOCUMENTS

| | | | |
|---|---|---|---|
| 2006/0091993 A1* | 5/2006 | Shoji | 338/32 R |
| 2007/0076332 A1* | 4/2007 | Shoji et al. | 360/324.12 |
| 2007/0090825 A1* | 4/2007 | Shoji | 324/117 R |

* cited by examiner

CURRENT SENSOR

BACKGROUND OF THE INVENTION

1. Field of the Invention

The present invention relates to a current sensor capable of precisely measuring current which flows through a conductor line.

2. Description of the Related Art

In order to accurately detect small control current flowing in a circuit of a control device, a method of connecting resistors in series in the circuit and measuring a voltage drop in the resistors is used in general. In this case, however, a load different from the control system is given, and there is a possibility that an adverse influence may be exerted on the control system. Consequently, a method of indirectly measuring a control current by detecting the gradient of a current magnetic field produced by the control current has been used. Specifically, an example includes a method of detecting a magnetic flux produced in a center portion of a toroidal core using a Hall device, the magnetic flux being produced by coiling a measurement line around the toroidal core to supply control current to the measurement line.

However, a current sensor capable of realizing the above-described method has problems that a miniaturization is difficult and that the linearity of detection sensitivity or high-frequency response are inadequate, etc. For this reason, a current sensor, in which a giant magnetoresistive element (hereinafter referred to as GMR element) developing a Giant Magneto-Resistive effect is arranged in a current magnetic field produced by the control current in order to detect its gradient, has been proposed (refer to U.S. Pat. No. 5,621,377, for example). Alternatively, in relation to the above, a technique of detecting flaws on a surface of a metal substrate etc. by use of a magnetic sensor provided with a GMR element has been also disclosed. The current sensor using such GMR elements can improve the detection sensitivity and high-frequency response relatively, and what is more, a detection characteristic that is stabilized against a temperature change is obtainable.

Also, although not using GMR elements, a current sensor, which includes a conductor line curved like a U-shape so as to include a pair of parallel portions facing each other and a magneto-sensitive resistor (barber pole structure) disposed on the parallel portions, respectively, has been proposed (for example, refer to Japanese Unexamined Patent Publication No. 6-294854). In the current sensor, current magnetic fields are produced by sending a current to be detected through the U-shaped conductor line, and are detected using the magneto-sensitive resistor. According to this sensor, since current magnetic fields change in proportion to a distance from the center position to the pair of parallel portions of the U-shaped conductor line, the current to be measured of a relatively broad range can be measured precisely and easily by adjusting the disposing position of the magneto-resistive resistor.

SUMMARY OF THE INVENTION

In these days, a current sensor, which is capable of precisely detecting a small variation of a current which flows through the conductor line and also which has more compact whole configuration is desired strongly. However, in association with the miniaturization of dimension, there is a tendency that current sensors, even if using the foregoing GMR elements, are susceptible to magnetic noise from the surroundings and generation of heat etc. Therefore, improvement in stability in a field of detection sensitivity and responsibility has been an issue. Although several attempts have been made until now such as making the shape of the GMR elements a long and slender strip in order to increase shape anisotropy and so on, it is still difficult to say that the performance levels has been reached to a fully stabilized level.

The present invention has been achieved in consideration of such problems, it is desirable to provide a current sensor capable of measuring a current to be detected of the order of 10 A to 200 A with high precision and stability while realizing a compact configuration.

According to an embodiment of the present invention there is provided a current sensor including a conductor line and a magnetic sensor in which resistance value changes according to a current magnetic field produced by a current to be detected flowing through the conductor line, wherein the conductor line includes: (A) a pair of parallel portions each having a same and uniform cross-sectional area, while extending in parallel with each other separated at a first distance therebetween; (B) a connecting portion connecting one end of one of the parallel portions and one end of the other of the parallel portions; and (C) a pair of terminal portions each connected to the other end of each of the parallel portions, while extending to face with each other separated at a second distance therebetween, the second distance being wider than the first distance, the terminal portions each having a larger cross-sectional area than that of each of the parallel portions. Here, a "cross-sectional area" means an area of a cross section orthogonal to an extending direction of the conductor line itself.

In the current sensor of an embodiment of the present invention, when a current to be detected flows from one of the pair of terminal portions into the other one of the pair of terminal portions in the conductor line having an almost U-shaped configuration as a whole, a current magnetic field is produced around each of the pair of parallel portions (as a central axis) and is applied to the magnetic sensor. At this time, since the pair of parallel portions have a same and uniform cross-sectional area each other, the current magnetic field makes a symmetric distribution on both sides of a hypothetical plane located at an equal distance from each of the pair of parallel portions so as to be stabilized. Further, since the pair of terminal portions extend to face with each other separated at a second distance being wider than the first distance therebetween, influence on the magnetic sensor given by the current magnetic field caused by a current flowing in the pair of terminal portions can be reduced. Moreover, since each of terminal portions has a larger cross-sectional area than that of each of the parallel portions, the Joule heat caused by the current to be detected is reduced and efficiently released to outside, and consequently an adverse influence on the magnetic sensor can be avoided.

In a current sensor of an embodiment of the present invention, it is preferred that all of the parallel portions, the connecting portion, and the terminal portions are formed in the same layer while having a uniform thickness over all. In this manner, more compact configuration can be realized. "Thickness" means a dimension thereof in a direction orthogonal to a plane that includes the pair of parallel portions.

In a current sensor of an embodiment of the present invention, in order to reduce electric resistance and to increase heat dissipation characteristic of a heat generated in the pair of parallel portions, it is preferred that the connecting portion has a bigger width than that of each of the parallel portions. Here, "width" means a dimension in the direction orthogonal to both of the extending direction and the thickness direction.

In a current sensor of an embodiment of the present invention, it is preferred that the distance between the terminal portions becomes longer and cross-sectional area thereof becomes larger with increases in distance from the other ends of the parallel portions.

In a current sensor of an embodiment of the present invention, the magnetic sensor may include a first and a second magnetoresistive elements each disposed along each of the parallel portions so that resistance value of one of the magnetoresistive elements changes in a direction opposite to that of the other of the magnetoresistive elements according to the current magnetic field produced by the current to be detected which flows through the conductor line. In this case, preferably, the current sensor further includes: a first and a second constant current sources supplying constant currents of a common value to the first and the second magnetoresistive elements, respectively; and a differential detector detecting difference in voltage drops caused in each of the first and the second magnetoresistive elements by the constant currents, thereby the current to be detected is detected on the basis of the difference in voltage drops.

In a current sensor of an embodiment of the present invention, each of the first and the second magnetoresistive elements preferably includes in order: a pinned layer having a magnetization direction pinned to a predetermined direction; an intermediate layer; and a free layer whose magnetization direction changes in accordance with an external magnetic field. In this case, preferably, the current sensor further includes a pair of bias applying means for applying a bias magnetic field to the first and the second magnetoresistive elements, respectively, the bias magnetic field being orthogonal to the magnetization directions of the free layers under no external magnetic field. Or, preferably, the current sensor may further includes a pair of bias applying means for applying a bias magnetic field to the first and the second magnetoresistive elements, respectively, the bias magnetic field having a parallel component and an orthogonal component, the parallel component being parallel to the magnetization direction of the free layer under no external magnetic field, and the orthogonal component being orthogonal to the parallel component.

According to the current sensor of an embodiment of the present invention, since a conductor line is configured in such a way that one ends of a pair of parallel portions each having a same and uniform cross-sectional area, while extending in parallel with each other being separated at a first distance therebetween are connected by a connecting portion, and further, since the other end of each of the parallel portions are connected to a pair of terminal portions, while extending to face with each other separated at a second distance therebetween, a stable current magnetic field can be produced around each of the parallel portions as a central axis when a current to be detected is supplied to the conductor line, thus the current magnetic field can be applied to a magnetic sensor. In this case, influence which is exerted by the current magnetic fields produced in the pair of terminal portions on the magnetic sensor can be reduced. Moreover, since each of the terminal portions has a larger cross-sectional area than that of each of the parallel portions, an adverse influence exerted by the Joule heat caused by the passage of the current to be detected can be avoided. Thereby, there is an effect of being able to realize a miniaturization while capable of measuring the current to be detected with high precision and stability.

Other and further objects, features and advantages of the invention will appear more fully from the following description.

DETAILED DESCRIPTION OF THE PREFERRED EMBODIMENTS

Embodiments of the present invention will be described in detail hereinbelow with reference to the drawings.

Figure 1:
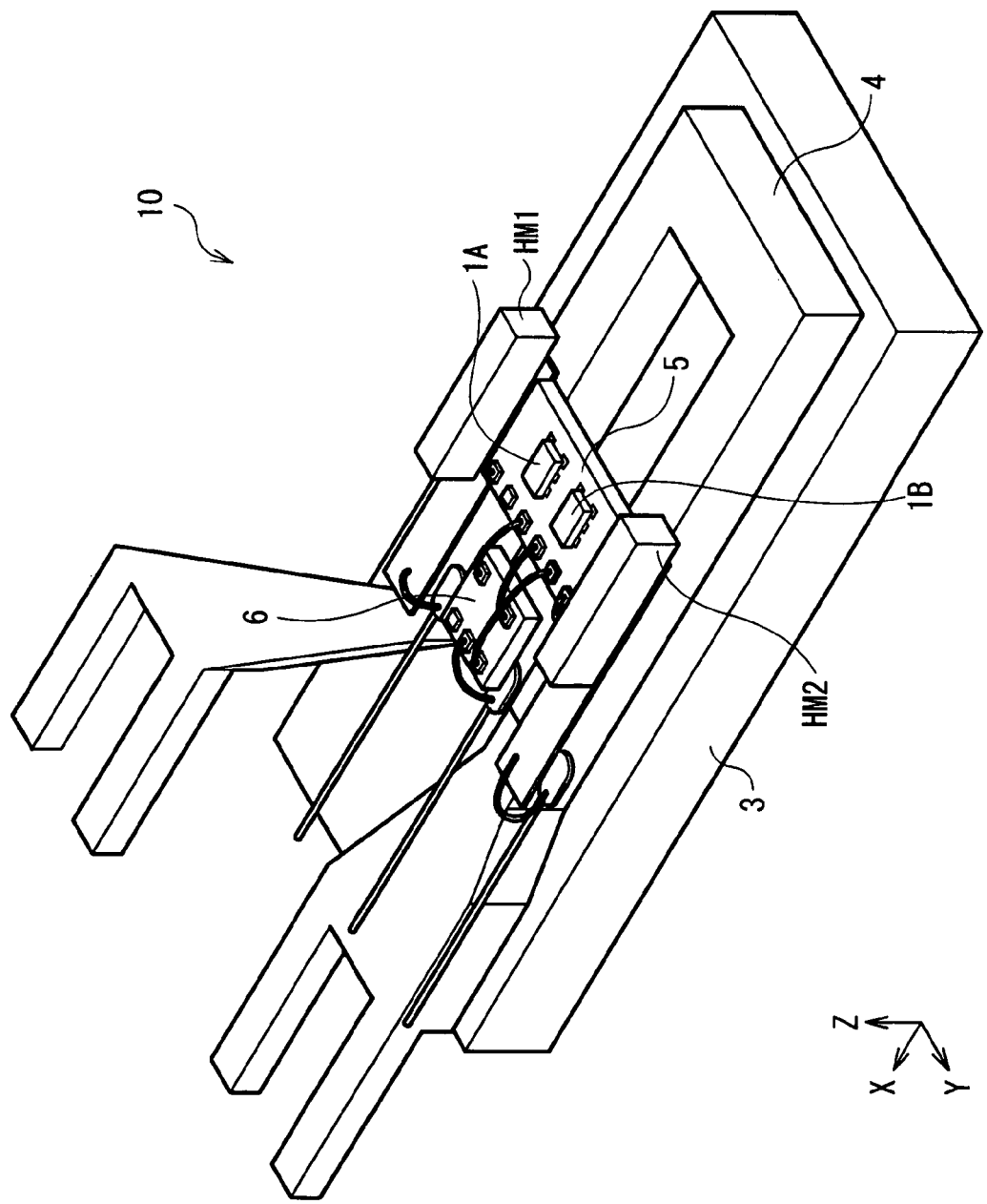
FIG. 1 is a perspective view showing a configuration of a current sensor according to an embodiment of the present invention.
Figure 2A:
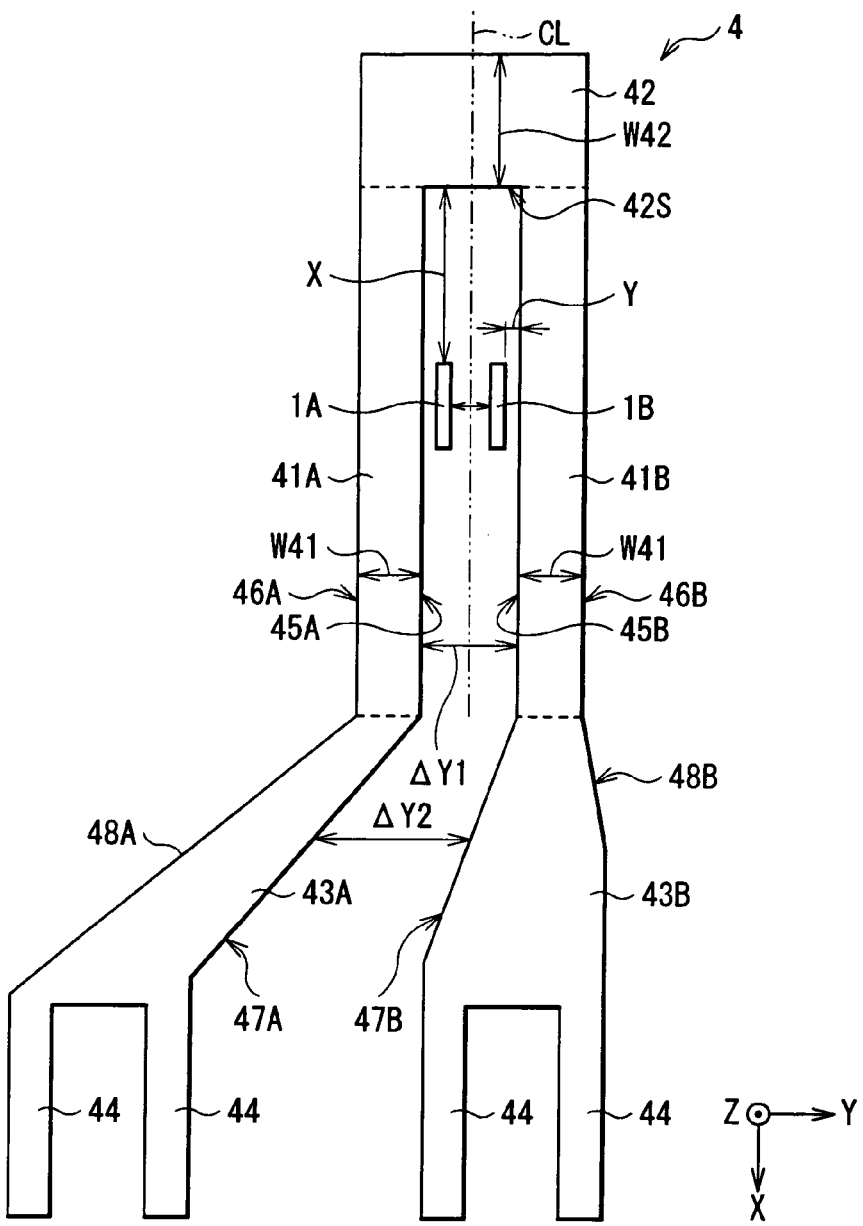
FIGS. 2A and 2B are a plan view and a side view showing a configuration of a conductor line in the current sensor shown in FIG. 1.
Figure 2B:
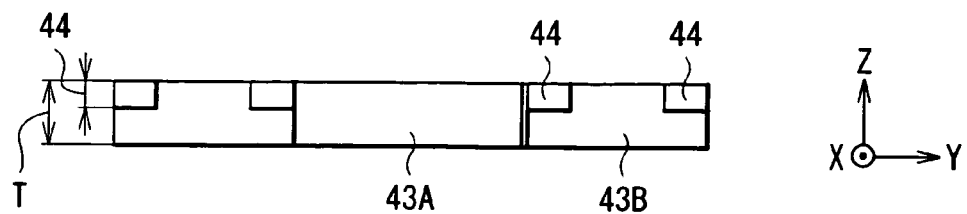
Figure 3:
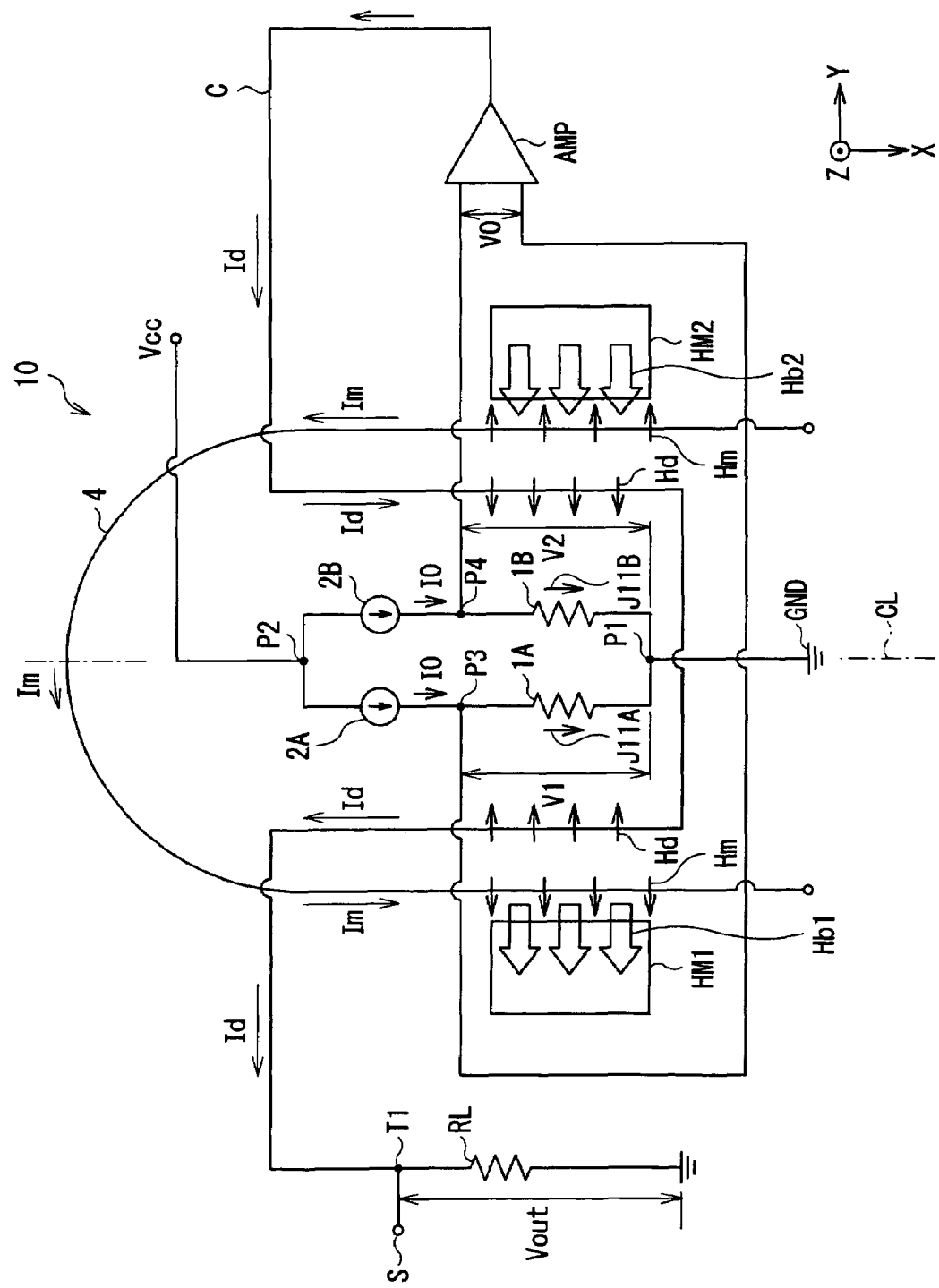
FIG. 3 is a circuit diagram corresponding to the current sensor shown in FIG. 1.

First, a configuration of a current sensor according to a first embodiment of the present invention will be explained with reference to FIG. 13. FIG. 1 is a schematic diagram showing a perspective configuration of a current sensor 10 according to the present embodiment, and FIGS. 2A and 2B are a plan view and a side view showing a schematic configuration of a conductor line 4 (which will be described later) in the current sensor 10 appearing in FIG. 1. FIG. 3 shows a circuit configuration of the current sensor 10. In FIG. 3, directions of all the arrows representing a current to be detected Im, a compensating current Id, current magnetic fields Hm, compensating current magnetic fields Hd, bias magnetic fields Hb1, Hb2, and a current I0 (all will be described later) indicate a relative direction with respect to a first and a second magnetoresistive elements 1A and 1B (which will be described later).

The current sensor 10 includes: a conductor line 4 disposed on a substrate 3; and a circuit board 5 which includes a first and a second magnetoresistive elements 1A and 1B having a function as a magnetic sensor (hereinafter just referred to as MR elements 1A and 1B) and which is disposed in the vicinity of the conductor line 4. The current sensor 10 has a function as an ammeter measuring a current to be detected Im supplied to the conductor line 4 using the MR elements 1A and 1B.

The conductor line 4 has a pair of parallel portions 41A and 41B, a connecting portion 42 connecting one ends of the parallel portions 41A and 41B each other, and a pair of terminal portions 43A and 43B which are connected to the other ends of the parallel portions 41A and 41B, respectively. All of the parallel portions 41A and 41B, the connecting portion 42, and the terminal portions 43A and 43B which configure the conductor line 4 have the same thickness T (for example, 1.2 mm), and they are all formed in the same layer.

The parallel portions 41A and 41B are disposed axisymmetrically with respect to a center line CL, located in a plane parallel to the plane including the MR element 1A and the MR element 1B, while separately extending in parallel with each other with a first distance ΔY1 therebetween (=1.8 mm, for example) along the center line CL. Further, the parallel portions 41A and 41B have the same and uniform cross-sectional area which is specified by a width W41 and a thickness T. Thereby, as shown by arrows in FIG. 3, current magnetic fields Hm of the equivalent magnitude produced by a current to be detected Im is applied in the −Y direction to the MR element 1A, and applied in the +Y direction to the MR element 1B. Namely, the MR elements 1A and 1B are disposed so that a resistance value R1 of the MR element 1A changes in a direction opposite to a resistance value R2 of the MR element 1B according to the current magnetic fields Hm in driving the current sensor. In this case, since the distance from the parallel portion 41A of the conductor line 4 to the MR element 1A and the distance from the parallel portion 41B to the MR element 1B are equal, the absolute value of the current magnetic fields Hm applied to each of the MR elements 1A and 1B is the same with each other. Also, preferably, the width W4 is equal to the thickness T. In this manner, the current magnetic fields Hm produced around the parallel portions 41A and 41B have a more symmetrical distribution in the cross sections intersecting orthogonally with the extending direction of the parallel portions 41A and 41B while having a higher flux density.

The connecting portion 42 has a width W42 (=1.8 mm, for example) which is larger than the first distance ΔY1 and the thickness T, thereby increasing heat dissipation characteristic by enlarging a contact area with the substrate 3.

The pair of terminal portions 43A and 43B extend to face with each other separated at a second distance ΔY2 therebetween which is longer than the first distance ΔY1, while having a cross-sectional area larger than that of the parallel portions 41A and 41B, respectively. Here, especially, the distance between the pair of terminal portions 43A and 43B becomes longer and cross-sectional area thereof becomes larger with increases in distance (namely, the second distance ΔY2 increases gradually) from the portions connected to the parallel portions 41A and 41B. For this reason, the Joule heat, which is mainly generated especially in the pair of parallel portions 41A and 41B having a small cross-sectional area with passage of the current to be detected Im, is efficiently released to the substrate 3 etc. via the pair of terminal portions 43A and 43B. The terminal portion 43A is crooked so that side faces 47A and 48A thereof and side faces 45A and 46A of the parallel portion 41A make an angle bigger than 90 degrees, respectively. Similarly, side faces 47B and 48B of the terminal portion 43B and side faces 45B and 46B of the parallel portion 41B make an angle bigger than 90 degrees, respectively. Specifically, the side face 45A and the side face 47A make an angle of 140 degrees, the side face 46A and the side face 48A make an angle of 130 degrees, the side face 45B and the side face 47B make an angle of 160 degrees, and the side face 46B and the side face 48B make an angle of 170 degrees. It is desirable that the foregoing angles are the closest possible to 180 degrees. The closer the angles come to 90 degrees, the more likely is it that current magnetic fields produced in the terminal portions 43A and 43B become a noise and have more serious adverse influence on the MR elements 1A and 1B. It is to be noted that each of the pair of terminal portions 43A and 43B has two terminals 44 at the end thereof opposite to each of the parallel portions 41A and 41B.

The MR elements 1A and 1B are disposed on the circuit board 5 provided on the conductor line 4 in a position which satisfies the following conditional expression (1).

$$Im \times \Delta Y1/X^2 < 10 \times 10^{-3} [A/m] \qquad (1)$$

where Im is a current to be detected (A), ΔY1 is a distance between the MR element 1A and the MR element 1B (namely, a gap between the side face 45A and the side face 45B), and X is a distance from the side face 42S of the connecting portion 42 to the MR element 1A or the MR element 1B in the X-axis direction. Here, it is desirable that the distance X is 3 mm or more when sending a current to be detected Im of 15 A, for example.

The MR elements 1A and 1B are connected each other at a first junction point P1, disposed axisymmetrically with respect to the center line CL which passes through the midpoint of a virtual straight-line connecting the MR elements, while extending along the center line CL (in the X-axis direction appearing in the figure) as shown in FIG. 3.

The current sensor 10 further includes a constant current source 2A (a first constant current source) and a constant current source 2B (a second constant current source) whose ends are connected each other in a second junction point P2 as shown in FIG. 3. The constant current source 2A is connected to the end of the MR element 1A on the side opposite to the first junction point P1 at a third junction point P3, while the constant current source 2B is connected to the end of the MR element 1B on the side opposite to the first junction point P1 at a fourth junction point P4. Namely, the MR element 1A and the constant current source 2A are connected in series and the MR element 1B and the constant current source 2B are connected in series, while both of the series connections are connected in parallel each other axisymmetrically with respect to the center line CL. Here, the constant current source 2A and the constant current source 2B are formed so as to supply an equal-valued constant current I0 to the MR element 1A and the MR element 1B, respectively. It is to be noted that the constant current sources 2A and 2B are arranged in the inside of a circuit board 5 provided on the substrate 3.

Permanent magnets HM1 and HM2 to be used as a bias applying means are disposed on an X-Y plane so as to face each other on both sides of the MR elements 1A and 1B (refer to FIG. 1 and FIG. 3). The current sensor 10 further includes a compensating current line C, and a compensating current Id, which is based on a potential difference between the third junction point P3 and the fourth junction point P4 produced when voltage is applied between the first junction point P1 and the second junction point P2, is supplied to the compensating current line C (FIG. 3). One end of the compensating current line C is connected to the output side of a differential amplifier AMP as a differential detector whose input side is connected to the third and fourth junction points P3 and P4, and the other end of the compensating current line C is grounded via a resistor RL. A compensating current detection means S is connected to the resistor RL at a junction point T1 on the side of the differential amplifier AMP. Here, the compensating current line C is configured in such a way that a compensating current Id applies a compensating current magnetic field Hd to each of the magnetoresistive elements 1A and 1B. The compensating current magnetic field Hd has a direction opposite to the current magnetic fields Hm produced by a current to be detected Im. Namely, the compensating current magnetic field Hd produced by the compensating current Id is applied in the +Y direction with respect to the MR element 1A and applied in the −Y direction with respect to the MR element 1B as indicated by arrows appearing in FIG. 3.

Figure 4:
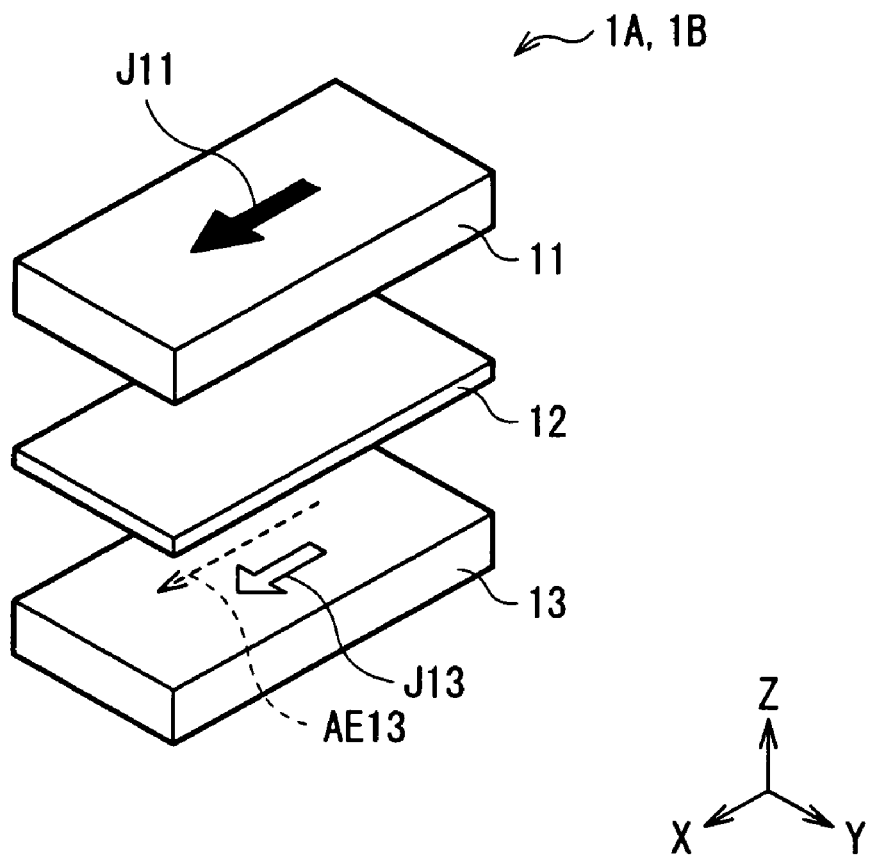
FIG. 4 is an exploded perspective view showing a structure of a magnetoresistive element which is the principal part of the current sensor shown in FIG. 1.

Next, the configuration of the MR elements 1A and 1B will be described more specifically with reference to FIG. 4. FIG. 4 is an exploded perspective view disassembling and showing the structure of the MR elements 1A and 1B.

As shown in FIG. 4, each of the MR elements 1A and 1B is a GMR element having a spin valve structure in which a plurality of function films including magnetic layers are layered. Each of the MR elements 1A and 1B includes a pinned layer 11 having a magnetization direction J11 pinned along the central line CL (in the +X direction in FIG. 4), a free layer 13 whose magnetization direction J13 changes according to external magnetic fields H such as the current magnetic field Hm, and an intermediate layer 12 which is disposed between the pinned layer 11 and the free layer 13 and does not show any specific magnetization direction. The free layer 13 is made of a soft magnetic material such as nickel iron alloy (NiFe). The intermediate layer 12 is made of copper (Cu), its top face being in contact with the pinned layer 11, and its bottom face being in contact with the free layer 13. The intermediate layer 12 may be made of a nonmagnetic metal having high conductivity such as gold (Au) as well as copper. The top face of the pinned layer 11 (the face on the side opposite to the intermediate layer 12) and the bottom face of the free layer 13 (the face on the side opposite to the intermediate layer 12) are protected with a protection film (not shown,) respectively. An exchange bias magnetic fields Hin in the magnetization direction J11 (hereinbelow, simply called "exchange bias magnetic field Hin") is produced between the pinned layer 11 and the free layer 13 which act on each other with the intermediate layer 12 in between. The intensity of the exchange bias magnetic field Hin changes as the spin direction in the free layer 13 rotates according to the interval between the pinned layer 11 and the free layer 13 (that is, the thickness of the intermediate layer 12). A direction of the exchange bias magnetic field Hin is the +X direction in this case. Although FIG. 4 shows one example of configuration in which the free layer 13, the intermediate layer 12, and the pinned layer 11 are layered in order from the bottom, it is not limited to the configuration but may be made in such a way as layered in the opposite order.

Figure 5:
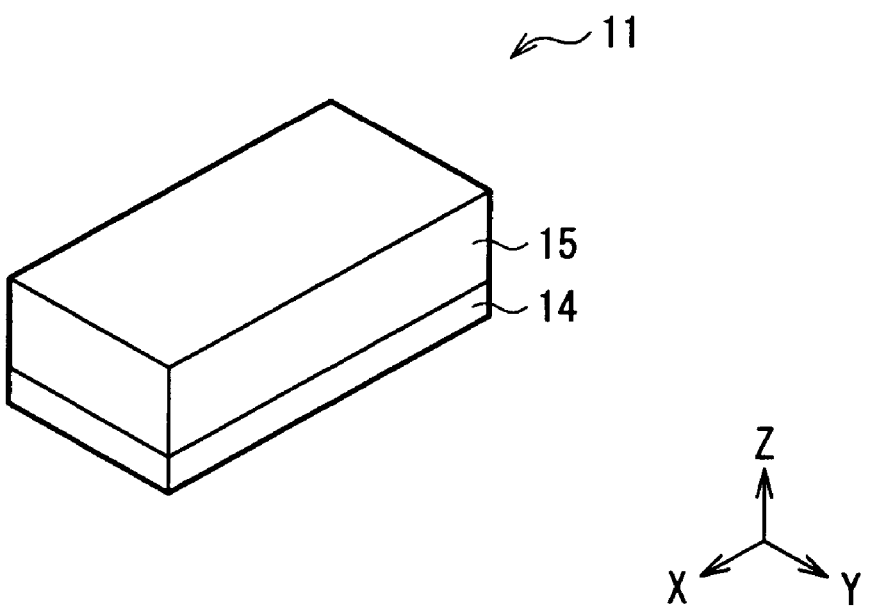
FIG. 5 is a perspective view showing a partial structure of the magnetoresistive element illustrated in FIG. 4.

A detailed structure of pinned layer 11 is shown in FIG. 5. The pinned layer 11 has a structure in which magnetization pinned film 14 and antiferromagnetic film 15 are layered in order from the intermediate layer 12 side. The magnetization pinned film 14 is made of a ferromagnetic material such as cobalt (Co) or cobalt iron alloy (CoFe). The magnetization direction of the magnetization pinned film 14 is the magnetization direction J11 of the pinned layer 11 as a whole. The antiferromagnetic film 15 is made of an antiferromagnetic material such as platinum manganese alloy (PtMn) or iridium manganese alloy (IrMn) The antiferromagnetic film 15 is in the state where the spin magnetic moment in the −X direction and that in the opposite direction (+X direction) completely cancel out each other, and functions so as to pin the magnetization direction J11 of the magnetization pinned film 14.

In the MR elements 1A and 1B structured as described above, the magnetization direction J13 of the free layer 13 rotates by application of the current magnetic field Hm, thereby changing a relative angle between the magnetization direction J13 and the magnetization direction J11. The relative angle is determined in accordance with the magnitude and direction of the current magnetic field Hm.

Figure 6:
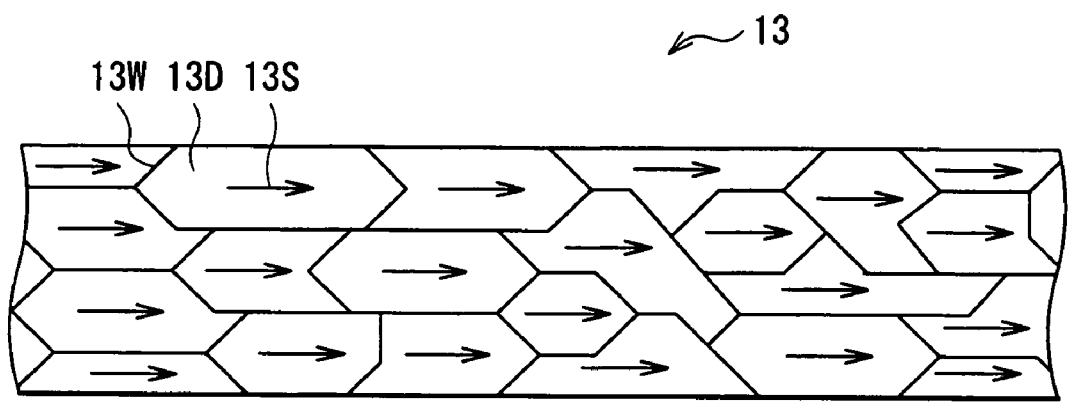
FIG. 6 is a pattern diagram showing a spin distribution in a free layer of the magnetoresistive element illustrated in FIG. 4.

FIG. 4 shows a no load state under no current magnetic field Hm (Hm=0) and the bias magnetic field Hb produced by the permanent magnets HM1 and HM2 is not applied (that is, a state under no external magnetic field H). Since a direction of magnetization easy axis AE13 of the free layer 13 is set so as to be parallel with the magnetization direction J11 of the pinned layer 11, all of the direction of magnetization easy axis AE13 and the magnetization direction J13 and the magnetization direction J11 are parallel to each other along the +X direction in this state. Consequently, the spin directions of respective magnetic domains in the free layer 13 align in almost the same direction. FIG. 6 is a conceptual diagram schematically showing the spin directions in the respective magnetic domains of the free layer 13. As shown in FIG. 6, the free layer 13 has a plurality of magnetic domains 13D divided with magnetic walls 13W, and the respective spins 13S are mostly directed in the same direction (the magnetization direction J13).

Figure 7:
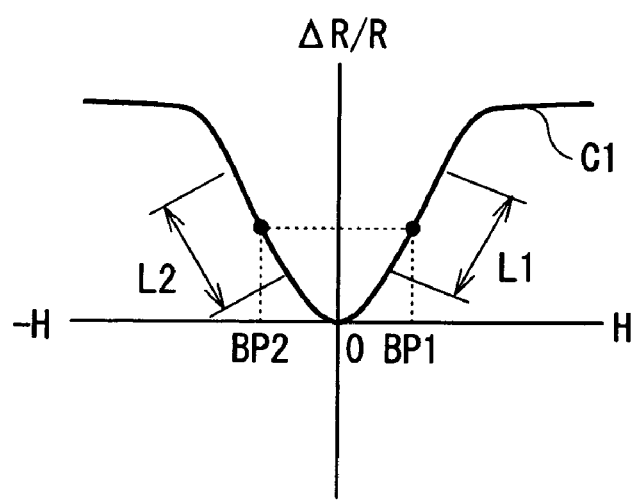
FIG. 7 is a characteristic diagram showing magnetic field dependency of a resistance change ratio in the magnetoresistive element illustrated in FIG. 4.

If an external magnetic field H is applied in the direction orthogonal to the magnetization direction J11 (+Y direction or −Y direction) to the MR elements 1A and 1B having the free layer 13 whose spin directions are aligned in one direction, characteristics as shown in FIG. 7 are obtained. FIG. 7 shows a relation between the external magnetic field H and a resistance change ratio ΔR/R letting the external magnetic field H in the +Y direction be a positive value of the external magnetic field H. As shown herein, the relation therebetween is expressed by one curve C1 in which the value becomes the minimum (ΔR/R=0) under no external magnetic field H (H=0) and which hardly shows any hysteresis. In this case, since a 1/f noise caused by hysteresis is extremely small, highly-sensitive and stable sensing can be realized.

Figure 8:
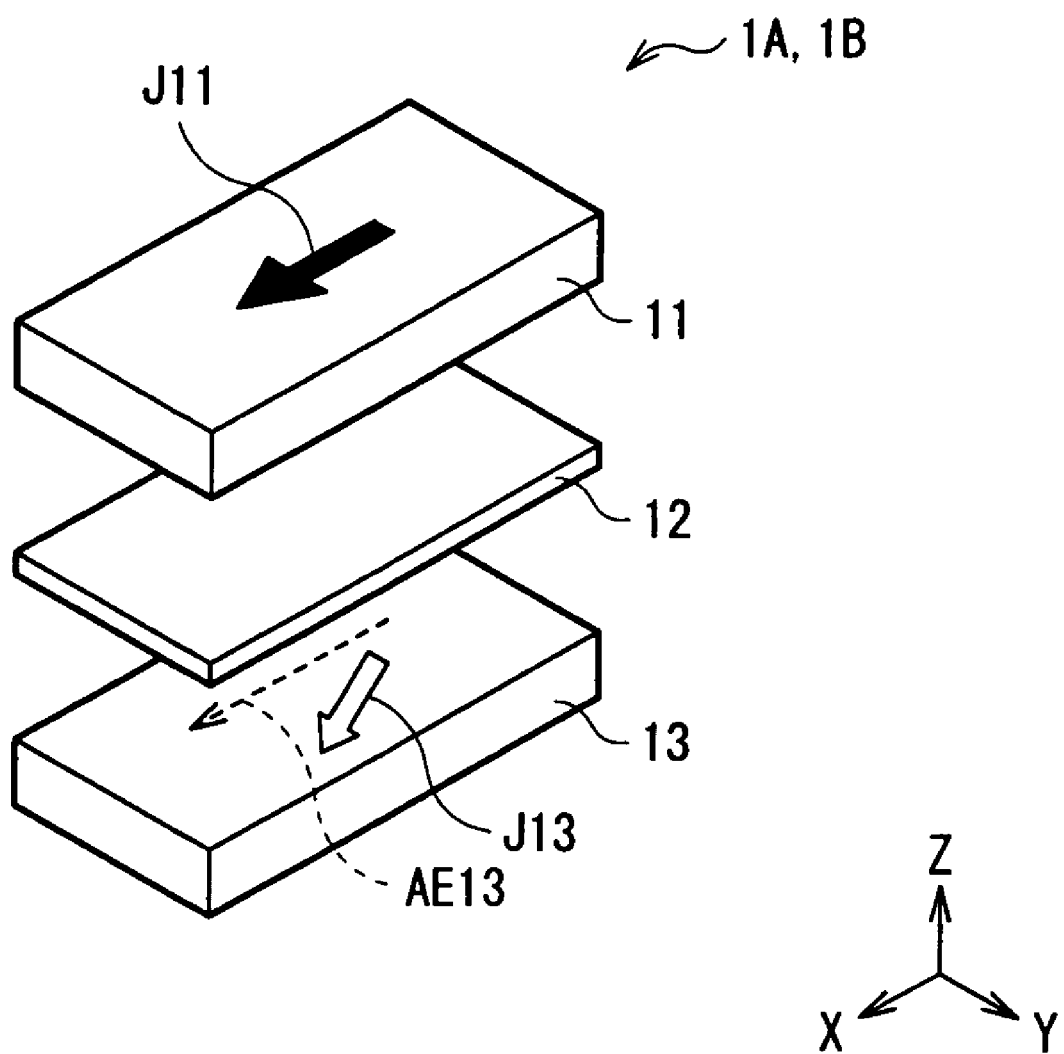
FIG. 8 is another exploded perspective view showing a structure of the magnetoresistive element which is the principal part of the current sensor illustrated in FIG. 1.

As is evident from FIG. 7, however, it is difficult to obtain a linear change in the vicinity of the zero point of the external magnetic field H (H=0). Therefore, in the case of actually measuring the current magnetic field Hm, a bias magnetic field Hb generated by the permanent magnets HM1 and HM2 is applied to the MR elements 1A and 1B, and the magnetization direction J13 is rotated to be slightly tilted so as to include a component in the +Y direction or a component in the −Y direction as shown in FIG. 8 (FIG. 8 shows a case where the magnetization direction J13 is tilted in the +Y direction). In this manner, variation of the current magnetic field Hm is detectable with good precision in the linear areas L1 and L2 including bias points BP1 and BP2 as their midpoints, as shown in FIG. 7. In the current sensor 10, since the magnetization directions J11 in the pinned layers 11 of the MR elements 1A and 1B are directed in the same direction (in the +X direction), the bias magnetic fields Hb1 and Hb2 having the same direction (the −Y direction) are to be applied to both of the MR elements 1A and 1B (refer to FIG. 3). In this manner, the resistance value R1 of the MR element 1A and the resistance value R2 of the MR element 1B show an opposite change each other when current magnetic fields Hm are detected. For example, bias magnetic fields Hb1 and Hb2 having an intensity corresponding to the bias point BP2 (refer to FIG. 7) are applied in advance in the −Y direction to the MR elements 1A and 1B. If a current to be detected Im is supplied as shown in FIG. 3, a resistance change ratio of the MR element 1A increases (the resistance value R1 increases) by applying the current magnetic field Hm in the −Y direction as is clear from FIG. 7. On the other hand, a resistance change ratio of the MR element 1B decreases (the resistance value R2 decreases) by applying the current magnetic field Hm in the +Y direction as is clear from FIG. 7.

In the current sensor 10 having such a configuration, a compensating current Id, which is based on a potential difference V0 (difference in the voltage drops generated in each of the MR elements 1A and 1B) between the third junction point P3 and the fourth junction point P4 when voltage is applied between the first junction point P1 and the second junction point P2, flows through the compensating current line C via the differential amplifier AMP used as a differential detector. The compensating current Id is detected by the compensating current detection means S. The differential amplifier AMP has a function of adjusting the compensating current Id so that a value of the difference V0 may become zero.

Hereinafter, a method of measuring the current magnetic field Hm produced by the current to be detected Im will be explained with reference to FIG. 3.

In FIG. 3, a constant current from the constant current sources 2A and 2B at the time of applying a predetermined voltage between the first junction point P1 and the second junction point P2 is represented as I0, and the resistance values of the MR elements 1A and 1B are represented as R1 and R2, respectively. When no current magnetic field Hm is applied, potential V1 in the third junction point P3 is given by the expression $$V1 = I0 \times R1$$

Potential V2 in the fourth junction point P4 is given by the expression $$V2 = I0 \times R2$$

Therefore, potential difference between the third junction point P3 and the fourth junction point P4 is given as follows:

$$V0 = V1 - V2 \quad (2)$$
$$= I0 \times R1 - I0 \times R2$$
$$= I0 \times (R1 - R2)$$

In this circuit, the amount of resistance change can be obtained by measuring the potential difference V0 when the current magnetic field Hm is applied. For example, when the current magnetic field Hm is applied, supposing that the resistance values R1 and R2 increase by variation amounts ΔR1 and ΔR2, respectively, the Equation (2) is rewritten as follows:

$$V0 = V1 - V2 \quad (3)$$
$$= I0 \times (R1 - R2)$$
$$= I0 \times \{(R1 + \Delta R1) - (R2 + \Delta R2)\}$$

As already stated, since the MR elements 1A and 1B are disposed so that the each of the resistance values R1 and R2 thereof changes in a direction opposite to each other by the current magnetic field Hm, the variation amounts ΔR1 and ΔR2 have an opposite positive/negative sign each other.

Therefore, in Equation (3), resistance values R1 and R2 before applying the current magnetic field Hm cancel out each other, while the variation amounts ΔR1 and ΔR2 remain as they are.

Supposing that both of the MR elements 1A and 1B have completely identical characteristics, that are:

$$R1 = R2 = R$$

and $$\Delta R1 = -\Delta R2 = \Delta R,$$

Equation (3) is rewritten as follows:

$$V0 = I0 \times (R1 + \Delta R1 - R2 - \Delta R2) \quad (4)$$
$$= I0 \times (R + \Delta R - R + \Delta R)$$
$$= I0 \times (2\Delta R)$$

Therefore, by using the MR elements 1A and 1B for which the relation between an external magnetic field and its resistance variation is grasped in advance, intensity of the current magnetic field Hm can be measured, and consequently the magnitude of the current Im to be detected, which generates the current magnetic field Hm, can be estimated. In this case, since sensing is performed using MR elements 1A and 1B, twice as much resistance variation can be obtained as compared with the case where sensing is performed using either one of the MR element 1A or the MR element 1B independently. Therefore, it is advantageous for obtaining a more accurate measurement value. On the other hand, since discrepancies in the characteristics of mutual MR elements and dispersion in the connection resistances, etc. can be restrained compared with a case where sensing is performed by configuring a bridge circuit using four MR elements, balance adjustment is made easy even if an MR element with high sensitivity is used. In addition, since the number of the MR elements itself can be reduced, the number of terminals naturally gets fewer, which is advantageous for space-saving.

In current sensor 10, a potential V1 detected in the third junction point P3 and a potential V2 detected in the fourth junction point P4 are supplied to the differential amplifier AMP, and the compensating current Id that makes the difference (potential difference V0) zero is outputted. The compensating current Id from the differential amplifier AMP produces a compensating current magnetic field Hd having a direction opposite to the current magnetic field Hm by flowing near the MR elements 1A and 1B in the direction opposite to the current to be detected Im, thereby canceling errors resulting from dispersion in the connection resistances in the circuit, discrepancies between the characteristics of the MR elements 1A and 1B, deviation of temperature distribution, or the disturbance magnetic fields from the outside, etc. As a result, it is possible to get closer to an intensity which is proportional only to the current magnetic field Hm. Therefore, by measuring an output voltage Vout and calculating the value of the compensating current Id in view of the relation with the known resistor RL in the compensating current detection means S, the value of the current magnetic field Hm can be calculated with more precision and the magnitude of the current Im to be detected can be estimated with high precision as a result.

Since the conditional expression (1) is satisfied, unnecessary current magnetic fields produced in the connecting portion 42 can be prevented from extending to the MR elements 1A and 1B. In particular, in the case of setting the distance X to 3 mm or more, the influence of the unnecessary current magnetic fields produced in the connecting portion 42 can be fully reduced.

As described above, according to the current sensor 10 of the present embodiment, the conductor line 4 is configured in such a way that ends of the pair of parallel portions 41A and 41B, which have the same and uniform cross-sectional area, while extending in parallel with each other separated at the first distance $\Delta Y1$ therebetween, are connected to each other via the connecting portion 42, and the pair of terminal portions 43A and 43B are respectively connected to the other ends of the parallel portions 41A and 41B, while extending to face with each other separated at the second distance $\Delta Y2$. In this manner, the conductor line 4 can generate a stable current magnetic field Hm around each of the parallel portions 41A and 41B (as central axis) by supplying a current to be detected Im to the conductor line 4 so that the current magnetic field Hm can be applied to the MR elements 1A and 1B. Under the circumstances, an influence of current magnetic fields, which is produced in the terminal portions 43A and 43B and which is exerted on the MR elements 1A and 1B, can be reduced. What is more, since the conditional expression (1) has been satisfied, an adverse influence of current magnetic fields produced in the connecting portion 42 is also avoidable. Still more, since the terminal portions 43A and 43B have a larger cross-sectional area than the parallel portions 41A and 41B, an adverse influence of the Joule heat cause by passage of the current to be detected Im can be reduced. Therefore, there is an effect of being able to attain a miniaturization while capable of detecting a current magnetic field Hm based on a much bigger current to be detected Im with high precision and stability.

<Modification>

Subsequently, a configuration of a modification of a current sensor according to the present embodiment will be explained with reference to FIG. 9. In the above-mentioned embodiment is explained a case where permanent magnets HM1 and HM2 are disposed on an X-Y plane so as to face each other on both sides of the MR elements 1A and 1B so that a bias magnetic field Hb having a direction orthogonal to the magnetization direction J13 of the free layer 13 under an unloaded condition is applied. As compared with this, the modification explains a case applying a bias magnetic field Hb having an oblique direction to the magnetization direction J13 of the free layer 13 under the unloaded condition.

Figure 9:
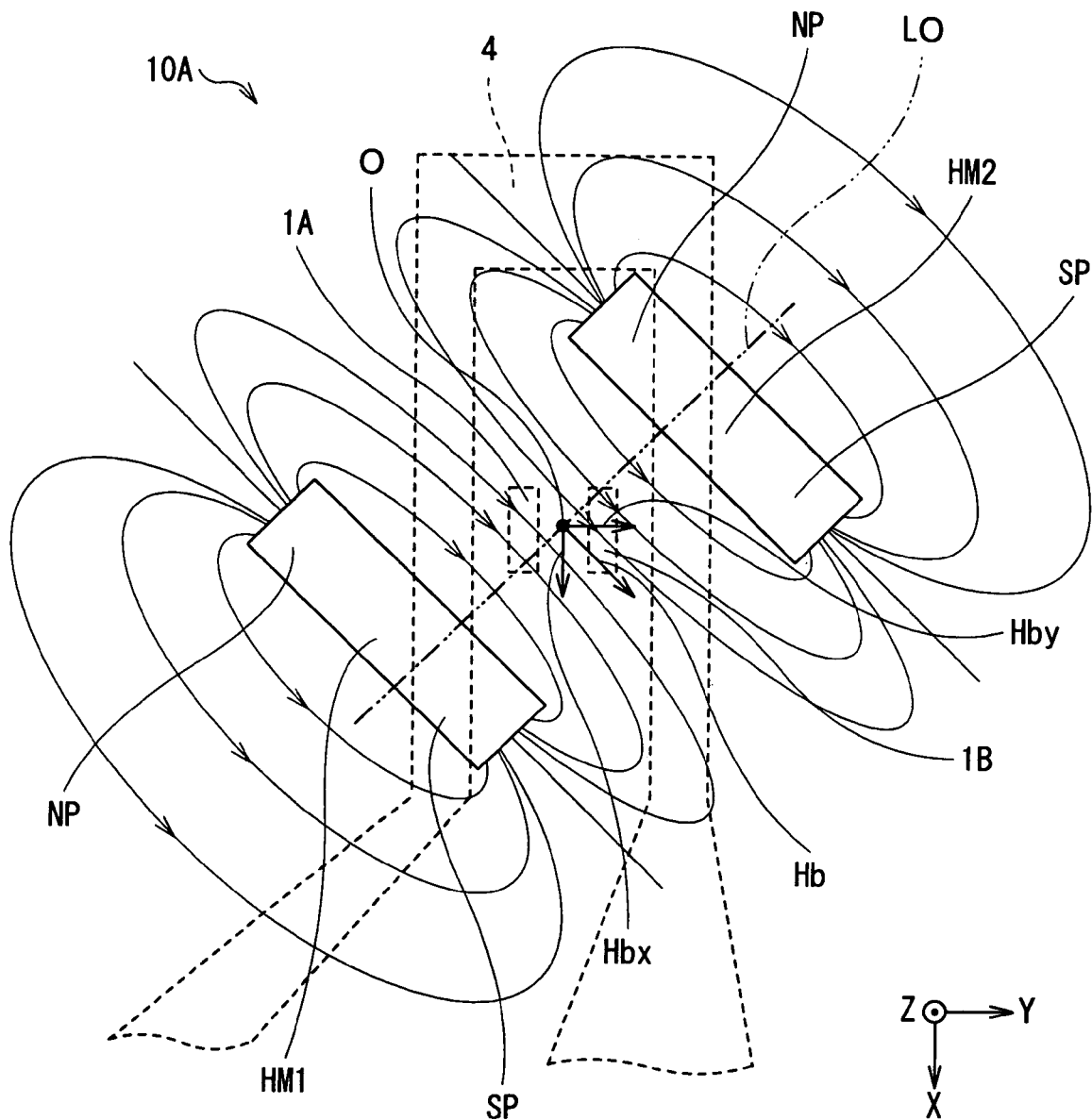
FIG. 9 is a plan view showing a schematic configuration of a modification of the current sensor illustrated in FIG. 1.

FIG. 9 is a plan view illustrating a schematic configuration of a current sensor 10A as the present modification. It is to be noted that the present modification has the same configuration as that of the above-mentioned embodiment except arrangement state of the permanent magnets HM1 and HM2. Therefore, here are mainly explained the arrangement state of the permanent magnets HM1 and HM2 and their operations, and other components and operations will be omitted according to circumstances.

As shown in FIG. 9, the permanent magnets HM1 and HM2 are disposed in parallel with each other so that each N pole NP and S pole SP turn to the same direction in order to intensify the mutual magnetic fluxes, while they are disposed so that a bias magnetic field Hb is applied in an oblique direction to the MR elements 1A and 1B. The bias magnetic field Hb applied to the MR elements 1A and 1B can be divided into a parallel component Hbx parallel to the magnetization direction J13 of the free layer 13, and orthogonal component Hby orthogonal to the magnetization direction J13 of the free layer 13. In addition, the flux density of a synthetic magnetic field of the parallel component Hbx in the bias magnetic field Hb and the exchange bias magnetic field Hin produced between the pinned layer 11 and the free layer 13, is preferably from $22 \times 10^{-4}$ teslas (T) to $52 \times 10^{-4}$ teslas (T) inclusive. On the other hand, the flux density of the orthogonal component Hby in the bias magnetic field is preferably from $15 \times 10^{-4}$ teslas (T) to $45 \times 10^{-4}$ teslas (T) inclusive.

In order to equalize the sensitivity of the MR elements 1A and 1B each other, it is desirable to equalize the values of the flux density of the bias magnetic field Hb applied to each of the MR elements 1A and 1B. For example, what is necessary is just to adjust the values of the flux density of the bias magnetic field Hb passing through each of the MR elements 1A and 1B by suitably moving the permanent magnets HM1 and HM2 along their respective extending directions away from each other in an opposite direction while their mutually-parallel location being maintained. Namely, the permanent magnet HM1 (or HM2) is moved so that the center position of the permanent magnet HM1 (or HM2) and the center position of the MR element 1A (or 1B) located in a relatively close position to the center position of the permanent magnet HM1 (or HM2) approach each other. Specifically, on the basis of a straight line LO, which passes through the midpoint O of the MR element 1A and the MR element 1B while intersecting orthogonally with the extending direction of the permanent magnets HM1 and HM2, it is desirable that the permanent magnet HM1 is moved in the direction where the center position of the MR element 1A is deviated from the straight line LO (namely, to the N pole NP side), and it is desirable to move the permanent magnet HM2 in the direction where the center position of the MR element 1B is deviated from the straight line LO (namely, to the S pole SP side).

The parallel component Hbx in the bias magnetic field Hb increases the uniaxial anisotropy of the free layer 13 as corresponding to an anisotropic magnetic field, consequently contributing to stabilization of the magnetic field detecting operation in the MR elements 1A and 1B. In related arts, a resistance change ratio has been raised by way of increasing shape anisotropy by developing the shape of the MR element itself long and slender and further by way of disposing two or more of the MR elements in parallel at a predetermined interval. In this manner, however, a relatively big space is required and furthermore a compensating current line has to be enlarged. On the other hand, according to the current sensor 10A of the present modification, the flexibility in designing the shape of the MR elements 1A and 1B is high because shape anisotropy is not used here, and there is no need of dividing each elements into two or more. Thereby, detection of the current magnetic field Hm can be performed with high precision and full stability while realizing a more compact configuration.

Thus, according to the current sensor 10A of the present modification, bias magnetic field Hb produced by the permanent magnets HM1 and HM2 has a parallel component Hbx parallel to the magnetization direction J13 under no external magnetic field H and an orthogonal component Hby orthogonal to the parallel component Hbx. Consequently, the uniaxial anisotropy of the free layer 13 can be strengthened without using shape anisotropy. Therefore, measurement of the current to be detected Im can be performed with high precision and stability.

EXAMPLE

Next, an example of the present invention will be explained hereinbelow.

Figure 10:
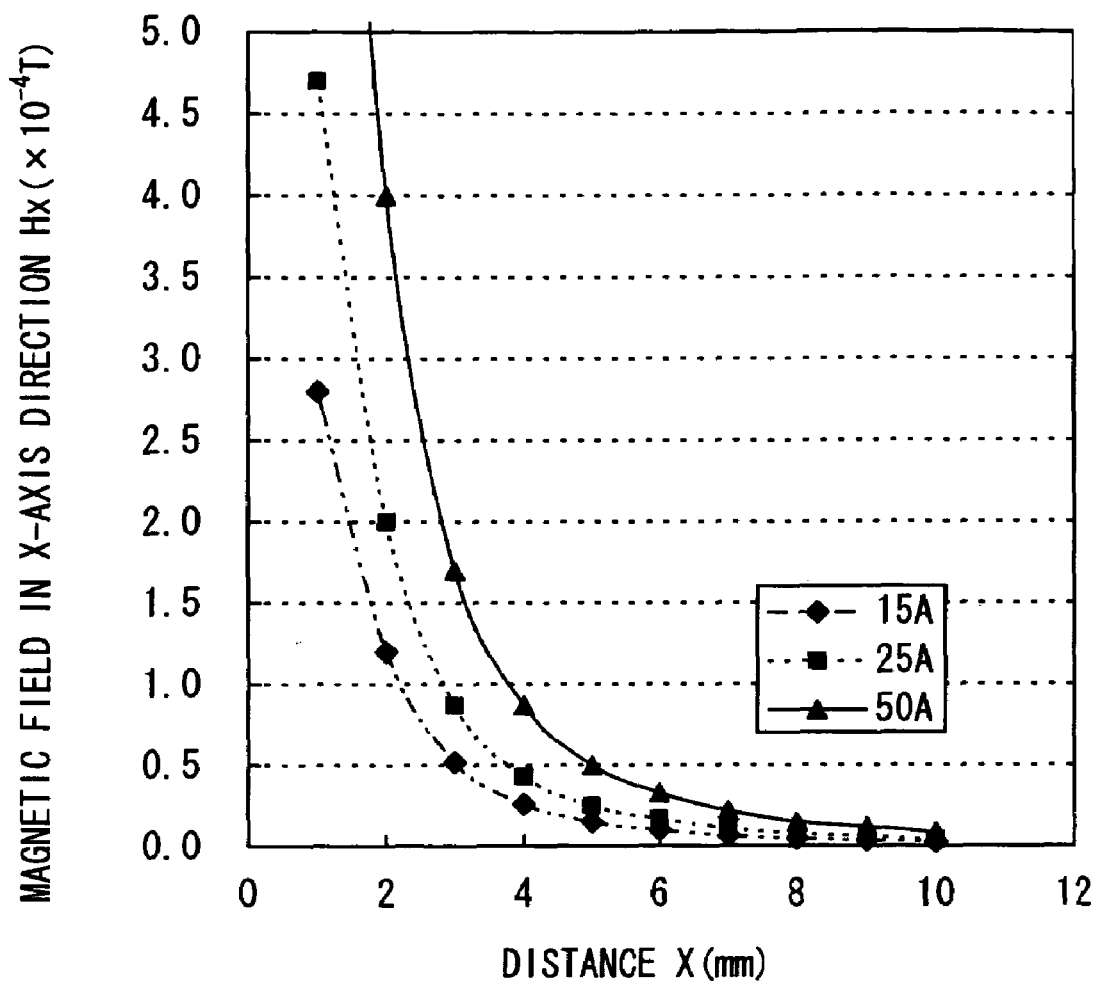
FIG. 10 is a first characteristic diagram showing a magnetic field distribution in the X-axis direction generated by the conductor line of the current sensor shown in FIG. 1.

FIG. 10 represents a magnetic field distribution in the X-axis direction generated when currents to be detected Im of 15 A, 25 A, and 50 A are supplied to the conductor line 4, respectively in the current sensor of the above-mentioned embodiment. In FIG. 10, the horizontal axis represents a distance X with an origin of the side face 42S of the connecting portion 42, and the vertical axis represents a magnetic field Hx along the X-axis direction. As shown in FIG. 10, in the case where a current to be detected Im was 50 A or below, if the distance X was 5 mm or more, the magnetic field Hx was $0.5 \times 10^{-4}$ T or less. In particular, if the distance X was set to 4 mm or more in the case where the current to be detected Im was 25 A, or if the distance X was set to 3 mm or more in the case where the current to be detected Im was 15 A, then the magnetic field Hx could be restrained to $0.5 \times 10^{-4}$ T or less. This is a magnitude usually comparable to the earth magnetism observed on the earth surface, and is not a level which affects operations of the current sensor.

Figure 11:
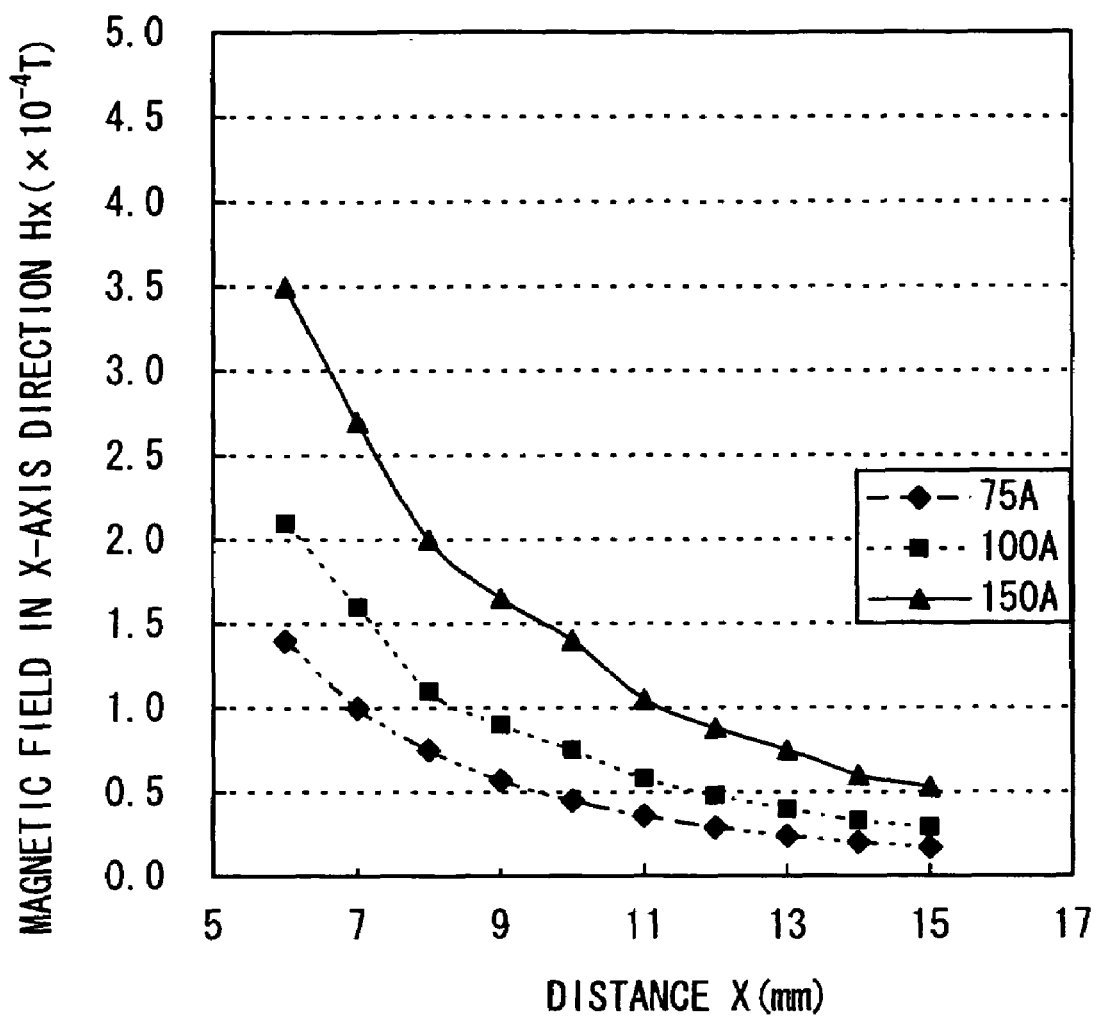
FIG. 11 is a second characteristic diagram showing a magnetic field distribution in the X-axis direction generated by the conductor line of the current sensor shown in FIG. 1.

Similarly, FIG. 11 represents a magnetic field distribution in the X-axis direction generated when currents to be detected Im of 75 A, 100 A, and 150 A are supplied to the conductor line 4, respectively. As shown in FIG. 11, if the distance X was set to 10 mm or more in the case where the current to be detected Im was below 75 A, if the distance X was set to 12 mm or more in the case where the current to be detected Im was 100 A, and if the distance X was set to 15 mm or more in the case where the current to be detected Im was 150 A, then the magnetic field Hx could be restrained to $0.5 \times 10^{-4}$ T or less.

Figure 12:
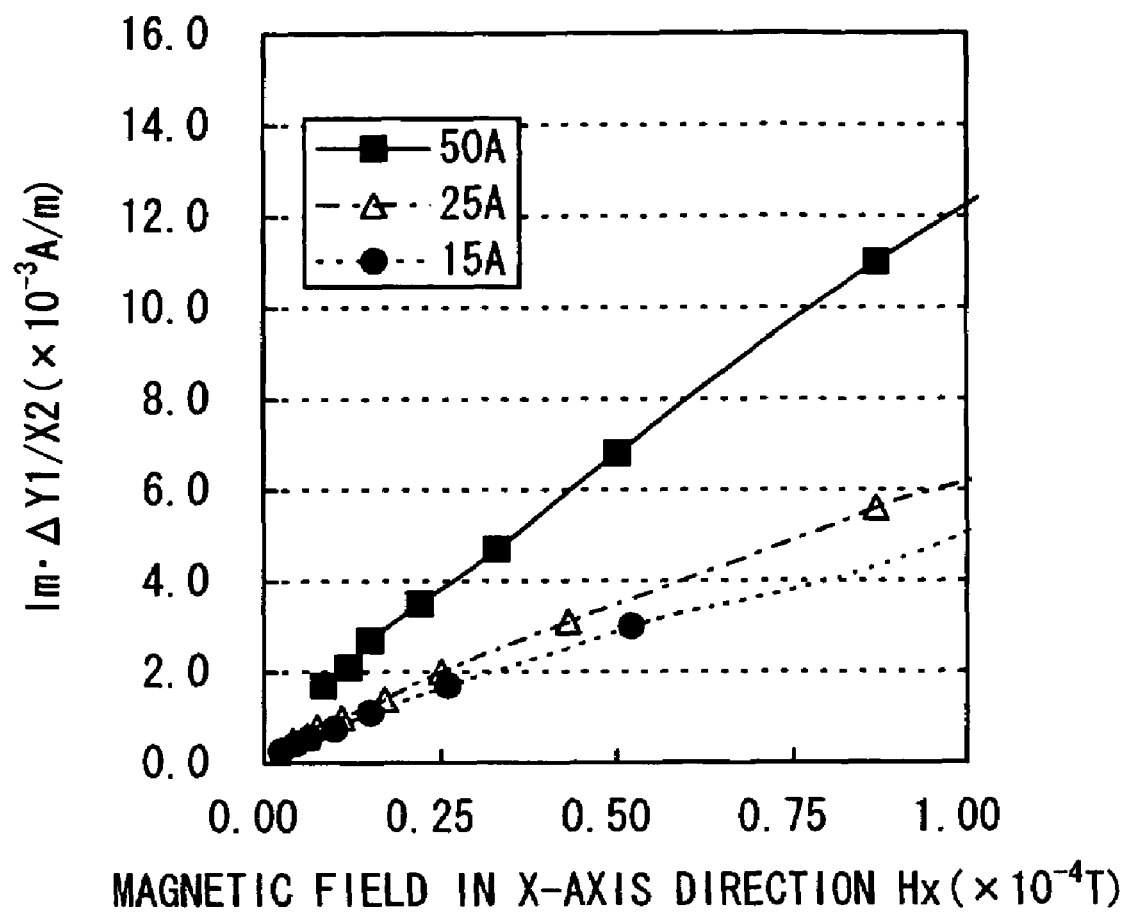
FIG. 12 is a third characteristic diagram showing a magnetic property with regard to a conditional expression (1) for the current sensor shown in FIG. 1.

FIG. 12 represents a relation between a magnetic field Hx in the X-axis direction produced when currents to be detected Im of 15 A, 25 A, and 50 A are respectively supplied to the conductor line 4, and a parameter $(Im \times \Delta Y1/X^2)$ of the conditional expression (1). In FIG. 12, the horizontal axis represents a magnetic field Hx along the X-axis direction, and the vertical axis represents a parameter of the conditional expression (1) $(Im \times \Delta Y1/X^2)$ As shown in FIG. 12, if the parameter $(Im \times \Delta Y1/X^2)$ was less than $6 \times 10^{-4}$ T in the case where the current to be detected Im was 50 A or less, it was confirmed that the magnetic field Hx in the X-axis direction was restrained to $0.5 \times 10^{-4}$ T or less.

Figure 13:
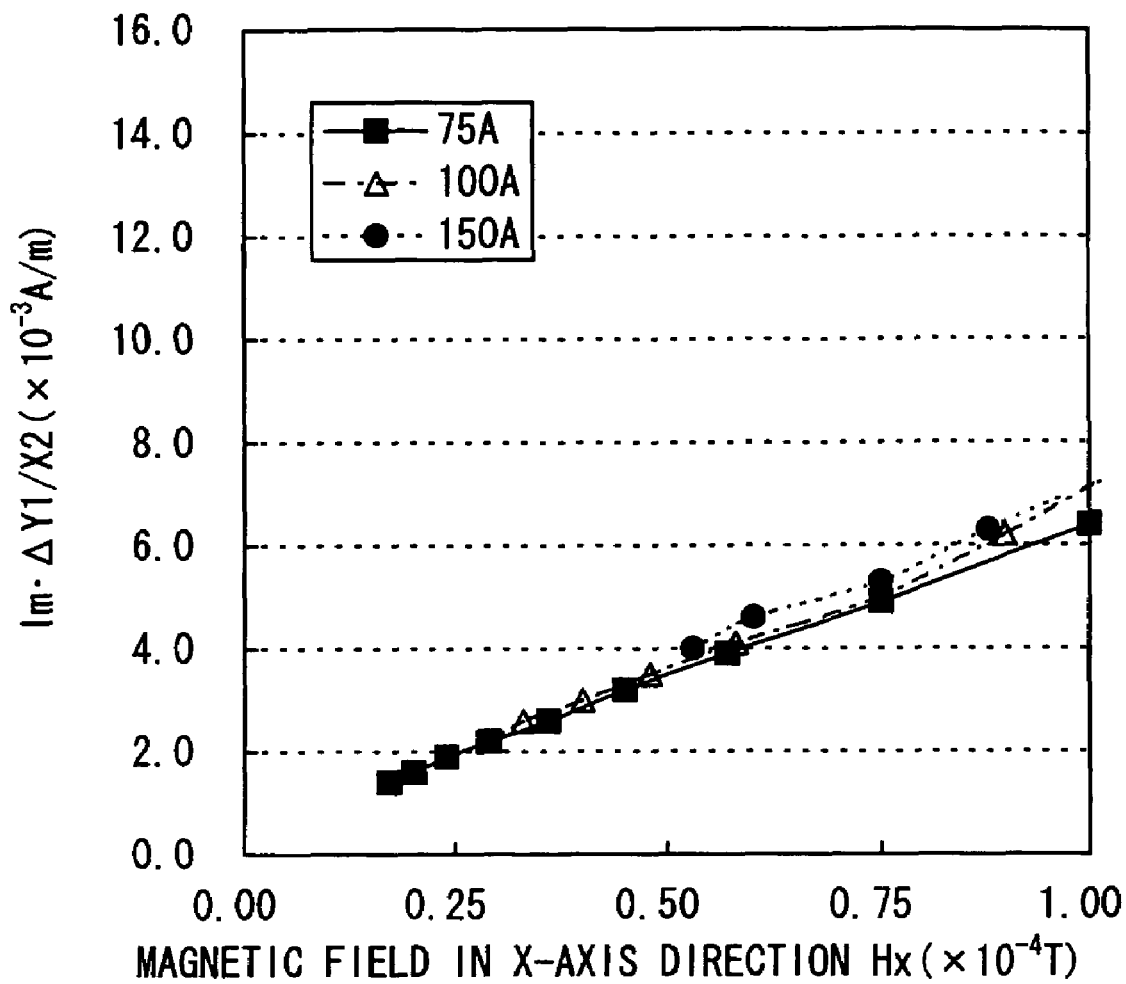
FIG. 13 is a fourth characteristic diagram showing a magnetic property with regard to the conditional expression (1) for the current sensor shown in FIG. 1.

FIG. 13 similarly represents a relation between a magnetic field Hx in the X-axis direction produced when currents to be detected Im of 75 A, 100 A, and 150 A are respectively supplied to the conductor line 4, and a parameter $(Im \times \Delta Y1/X^2)$ of the conditional expression (1). As shown in FIG. 13, if the parameter $(Im \times \Delta Y1/X^2)$ was less than $3 \times 10^{-4}$ T in the case where the current to be detected Im was 150 A or less, it was confirmed that the magnetic field Hx in the X-axis direction was restrained to $0.5 \times 10^{-4}$ T or less.

As mentioned above, the present invention has been described with reference to the embodiments and example, but the present invention is not limited to the foregoing embodiment and so on, and various modifications are obtainable. For example, although there is employed a magnetoresistive element which is configured in such a way that the magnetization direction of a free layer under no external magnetic field is in parallel with the magnetization direction of a pinned layer according to the present embodiment, it is not limited to this. For example, it is possible to employ a magnetoresistive element which is configured in such a way that the magnetization direction of the free layer under no external magnetic field is orthogonal to the magnetization direction of the pinned layer.

Figures 14A, 14B:
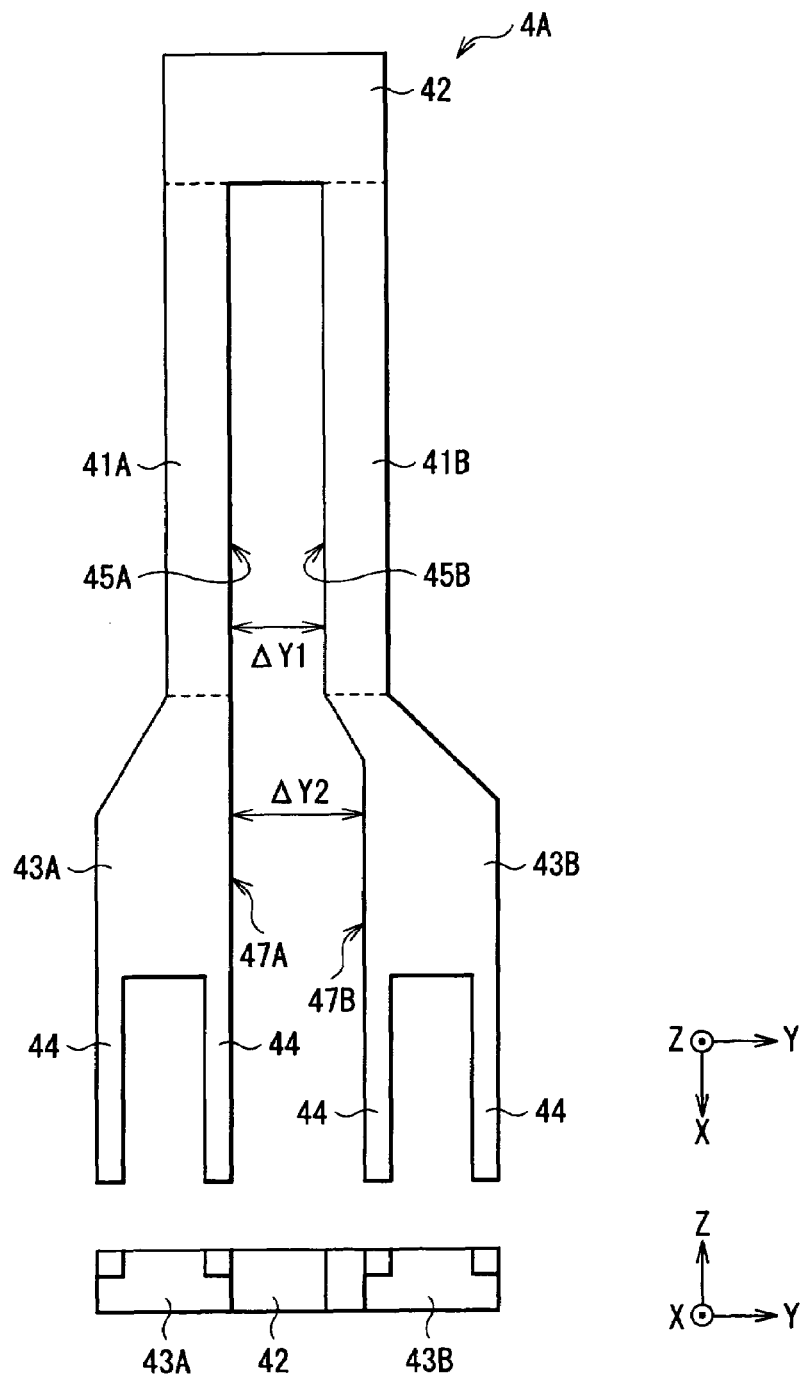
FIGS. 14A and 14B are a plan view and a side view showing a configuration of a modification of conductor line in the current sensor illustrated in FIG. 1.

The configuration of the conductor line of the present invention is not limited to the conductor line 4 shown in FIGS. 1 and 2. For example, it may be a configuration like a conductor line 4A as a modification appearing in FIG. 14. Specifically, a side face 47A of a terminal portion 43A which is connected to a parallel portion 41A and is facing the other terminal 43B may be located on extension of a side face 45A of the parallel portion 41A facing the other parallel portion 41B. In this case, the side face 47B of the terminal portion 43B recesses from the extension of a side face 45B of the parallel portion 41B. Thereby, with this configuration, a distance $\Delta Y2$ from the side face 47A to the side face 47B is larger than a distance $\Delta Y1$ from the side face 45A to the side face 45B. The side face 47A and side face 47B may be parallel or may not be parallel to each other. In addition, although a thickness of each of the connecting portion 42 and the terminal portions 43A and 43B is equivalent to a thickness of each of the parallel portions 41A and 41B, the width of the connecting portion 42, the terminal portions 43A and 43B are respectively larger than that of the parallel portions 41A and 41B. As a result, the resistance produced in sending a current to be detected can be lowered and a heat dissipation characteristic can be increased. Thus, in the case where the conductor line 4A has such a configuration, it is also capable of generating a stable current magnetic field around each of the parallel portions 41A and 41B as a central axis and also it is capable of efficiently releasing the Joule heat caused by passage of a current to the exterior. Therefore, a current sensor using the conductor line 4A can measure a bigger current to be detected with high precision and stability by detecting a current magnetic field which is produced thereby while capable of attaining a miniaturization also.

In addition, permanent magnets are disposed face to face as a means of applying a bias magnetic field according to the foregoing embodiment, but it is not limited to this. For example, a solenoid coil may be used instead of the permanent magnets.

In addition, according to the foregoing embodiments and so on, the direction of the exchange bias magnetic field Hin and the direction of the parallel component Hbx are in the same direction each other, but reverse directions therebetween may be allowable. However, the configuration on the basis of the same direction is preferred because that makes the detecting operation more stabilized.

Besides, although there has been explained a case where the magnetic sensor is constituted by two MR elements according to the above-mentioned embodiment, the present invention is not limited to this, either. For example, four MR elements may be disposed in the vicinity of the parallel portions so as to form a full bridge structure.

Obviously many modifications and variations of the present invention are possible in the light of the above teachings. It is therefore to be understood that within the scope of the appended claims the invention may be practiced otherwise than as specifically described.

What is claimed is:

1. A current sensor comprising:
 a conductor line that includes:
  a pair of parallel portions extending in parallel with each other separated by a first distance therebetween, each of the parallel portions having a same and uniform cross-sectional area orthogonal to an extending direction of each of the parallel portions;
  a connecting portion connecting one end of one of the parallel portions and one end of the other of the parallel portions; and
  a pair of terminal portions each connected to the other end of each of the parallel portions, while extending to face each other separated by a second distance therebetween, the second distance being wider than the first distance, the terminal portions each having a larger cross-sectional area orthogonal to an extending direction of each of the terminal portions than the cross-sectional area of each of the parallel portions orthogonal to the extending direction of each of the parallel portions;

a magnetic sensor in which resistance value changes according to a current magnetic field produced by a current to be detected flowing through the conductor line, the magnetic sensor including first and second magnetoresistive elements each disposed along each of the parallel portions so that the resistance value of one of the magnetoresistive elements changes in a direction opposite to that of the other of the magnetoresistive elements according to the current maanetic field produced by the current to be detected which flows through the conductor line;

first and second constant current sources supplying constant currents of a common value to the first and the second magnetoresistive elements respectively; and a differential detector detecting a difference in voltage drops caused in each of the first and the second magnetoresistive elements by the constant currents, wherein the current to be detected is detected on the basis of the difference in voltage drops.

2. A current sensor according to claim 1, wherein all of the parallel portions, the connecting portion, and the terminal portions are formed in the same layer while having a uniform thickness over all.

3. A current sensor according to claim 1, wherein the connecting portion has a bigger width than that of each of the parallel portions.

4. A current sensor according to claim 1, wherein the distance between the terminal portions becomes longer with increases in distance from the other ends of the parallel portions so as to increase the second distance and cross-sectional area of the terminal portions orthogonal to an extending direction of each of the terminal portions.

5. A current sensor according to claim 1, wherein each of the first and the second magnetoresistive elements comprises in order: a pinned layer having a magnetization direction pinned to a predetermined direction; an intermediate layer; and a free layer whose magnetization direction changes in accordance with an external magnetic field.

6. A current sensor according to claim 1, further comprising a pair of bias applying means for applying a bias magnetic field to the first and the second magnetoresistive elements, respectively, the bias magnetic field being orthogonal to the magnetization directions of the free layers under no external magnetic field.

7. A current sensor according to claim 1, further comprising a pair of bias applying means for applying a bias magnetic field to the first and the second magnetoresistive elements, respectively, the bias magnetic field having a parallel component and an orthogonal component, the parallel component being parallel to the magnetization direction of the free layer under no external magnetic field, and the orthogonal component being orthogonal to the parallel component.

8. A current sensor according to claim 1, wherein the terminal portions make obtuse angles with the parallel portions at the connection points of the terminal portions with the other ends of the parallel portions.

* * * * *